United States Patent
Guillot et al.

(10) Patent No.: US 10,270,247 B2
(45) Date of Patent: Apr. 23, 2019

(54) POWER SWITCH MODULE, SMART GRID POWER SUPPLY ARRANGEMENT AND METHOD THEREFOR

(71) Applicant: FREESCALE SEMICONDUCTOR, INC., Austin, TX (US)

(72) Inventors: Laurent Guillot, Seysses (FR); Philippe Dupuy, Toulouse (FR)

(73) Assignee: NXP USA, INC., Austin, TX (US)

( * ) Notice: Subject to any disclaimer, the term of this patent is extended or adjusted under 35 U.S.C. 154(b) by 345 days.

(21) Appl. No.: 15/254,525

(22) Filed: Sep. 1, 2016

(65) Prior Publication Data

US 2017/0279268 A1    Sep. 28, 2017

(30) Foreign Application Priority Data

Mar. 23, 2016 (EP) .................... 16290052

(51) Int. Cl.
*H02H 3/02* (2006.01)
*H02H 5/04* (2006.01)
*H02H 9/02* (2006.01)
*H02H 3/087* (2006.01)
*H03K 17/0812* (2006.01)
*H02J 1/08* (2006.01)
*H03K 17/08* (2006.01)

(52) U.S. Cl.
CPC ............... *H02J 1/08* (2013.01); *H02H 3/025* (2013.01); *H02H 3/087* (2013.01); *H02H 5/041* (2013.01); *H03K 17/08122* (2013.01); *H02H 9/025* (2013.01); *H03K 2017/0806* (2013.01)

(58) Field of Classification Search
CPC ......... H02H 3/025; H02H 5/041; H02H 9/025
USPC ....................... 361/104, 93.1, 91.1
See application file for complete search history.

(56) References Cited

U.S. PATENT DOCUMENTS 7,808,757 B2 * 10/2010 Guillott .................. H02H 3/06
361/93.1
2004/0178778 A1 * 9/2004 Bansal .................... G05F 1/575
323/274

OTHER PUBLICATIONS

U.S. Appl. No. 15/132,855, Inventor Philippe Dupuy, "A Packaged Unidirectional Power Transistor and Control Circuit Therefore", filed Apr. 19, 2016.

* cited by examiner

*Primary Examiner* — Dharti H Patel

(57) ABSTRACT

A power switch module comprising a control component. Upon an indicated operating condition fulfilling a protection condition, the control component is arranged to transition the power switch module from an ON state to a latched-OFF state in which the control component is arranged to configure the switching device to be turned off to decouple the load node from the power supply node. Having transition to the latched-Off state, the control component is further arranged to determine whether a voltage level at the load node exceeds a threshold voltage level, and if it is determined that the voltage level at the load node exceeds the threshold voltage level, transition the power switch module from the latched-OFF state to a current-limited state in which the control component is arranged to control the switching device to limit current-flow there through.

20 Claims, 3 Drawing Sheets

POWER SWITCH MODULE, SMART GRID POWER SUPPLY ARRANGEMENT AND METHOD THEREFOR

FIELD

This invention relates to a power switch module, a smart grid power supply arrangement and a method of controlling a power switch module.

BACKGROUND

FIG. 1 illustrates a simplified block diagram of a smart grid power supply arrangement 100 for an electronic control unit (ECU) 150, such as may form a part of an automotive system. In a smart grid power supply arrangement, multiple power supply lines are provided in parallel to supply power to components, such as the ECU 150 in FIG. 1.

The smart grid power supply arrangement 100 illustrated in FIG. 1 consists of two power supply lines, Vsup_1 102 and Vsup_2 104. The first power supply line Vsup_1 102 is coupled to a power supply VBat 105 via a first primary power switch 110. The second power supply line Vsup_2 is coupled to the power supply VBat 105 via a second primary power switch 120. The primary power switches 110, 120 consist of 'smart' power switches arranged to provide protection against, for example, over-current and over-voltage conditions on the respective power supply lines 102, 104.

The ECU 150 is coupled to the first power supply line Vsup_1 102 via a first secondary power switch 130, and to the second power supply line Vsup_2 104 via a second secondary power switch 140. The secondary power switches 130, 140 also consist of smart power switches arranged to provide protection to the ECU 150 against, for example, over-current and over-voltage conditions from the power supply lines 102, 104.

FIG. 2 illustrates the smart grid power supply arrangement 100 of FIG. 1 upon a short circuit to ground occurring on the second power supply line Vsup_2 104. When the second power supply line Vsup_2 104 is shorted to ground, a resulting over-current through the second primary power switch 120 will cause the second primary power switch protection circuitry to latch-off the second primary power switch 120, isolating the second power supply line Vsup_2 104 from the power supply VBat 105. As a result, the second power supply line Vsup_2 104 will be tied to ground, and have a voltage level of 0V. Consequently, the secondary power switches 130, 140 will end up being coupled in series between the first power supply line Vsup_1 102, having a voltage equal to the power supply VBat 105, and the second power supply line Vsup_2 104, having a voltage of 0V. In automotive applications and the like, the power supply VBat 105 may reach voltage levels in the region of, for example, 40V during a 'load dump'. As a result, and as illustrated in FIG. 2, the first power supply line Vsup_1 102 may have a voltage level of 40V.

Thus, in the supply line short circuit scenario illustrated in FIG. 2, a 40V drop occurs across the secondary power switches 130, 140, with an initial low resistance path through the secondary power switches 130, 140 from the first power supply line Vsup_1 102 to the second power supply line Vsup_2 104.

A resulting high current flow through the first secondary power switch 130 will trigger the over-current protection functionality of the first secondary power switch 130, for example when the current flow exceeds a trip current of 50 A, causing the first secondary power switch 130 to be latched off.

A resulting high reverse voltage across the second secondary power switch 140 will trigger reverse voltage protection circuitry that will limit the reverse voltage across the second secondary power switch 140 (by allowing current to bypass the device when the reverse voltage exceeds a threshold, e.g. 22V).

As a result of the first secondary-power switch 130 being latched off, the ECU 150 is no longer coupled to an active power supply line, and thus no longer being supplied with power. Accordingly, although the original fault only occurred on one of the power supply lines (i.e. the short to ground on the second power supply line Vsup_2 104), the fault has resulted in the protection circuitry of the secondary power switches decoupling the ECU 150 from the fault-free power supply line, leaving the ECU without a power supply.

SUMMARY

The present invention provides a power switch module, a smart grid power supply arrangement and a method of controlling a power switch module as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

In accordance with some example embodiments of the present invention, there is provided a power switch module arranged to couple a load such as an electronic control unit to a power supply. Upon an operating condition of a switching device within the power switch module fulfilling a protection condition (e.g. in the event of an over-current or over-temperature condition occurring), a control component of the power switch module is arranged to transition the power switch module from an ON state to a latched-OFF state in which the switching device is turned off to decouple the load from the power supply. Having transitioned to the latched-Off state, the control component is further arranged to determine whether a voltage level at the load exceeds a threshold voltage level, and if it is determined that the voltage level at the load exceeds the threshold voltage level, to transition the power switch module from the latched-OFF state to a current-limited state in which the switching device is controlled to limit current-flow there through. In the current-limited state, the switching device is protected from an over-current condition, whilst still enabling the load to be coupled to the power supply.

Figure 3:
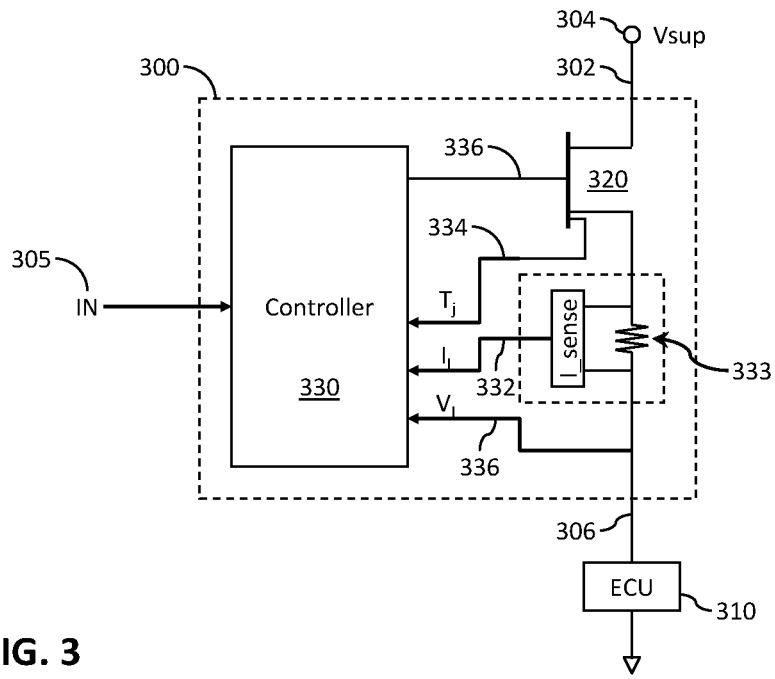
FIG. 3 illustrates a simplified block diagram of an example of a power switch module.

Referring now to FIG. 3, there is illustrated a simplified block diagram of an example of a power switch module 300. The power switch module 300 may be implemented within a silicon or gallium nitride semiconductor device, and has a power supply node 302 arranged to be coupled to a power supply Vsup 304 and a load node 306 arranged to be coupled to a load, which in the illustrated example consists of an electronic control unit (ECU) 310. The power switch module 300 includes a switching device 320 coupled between the power supply node 302 and the load node 306, and controllable to selectively couple the power supply node 302 to the load node 306. The power switch module 300 further includes a control component 330 arranged to control the power switch component 320 via a control signal 336, and to receive operating condition indications for the switching device 320, which in the illustrated example consist of an indication $I_L$ 332 of current-flow through the switching device and an indication Tj 334 of a junction temperature for the switching device 320. In the example illustrated in FIG. 3, the indication $I_L$ 332 of current-flow through is generated using a shunt resistor 333. It may equally be generated using a sense FET inside the switching device 320. In the example illustrated in FIG. 3, the control component 330 is further arranged to receive an indication $V_L$ 336 of a voltage level at the load node 306.

Figure 4:
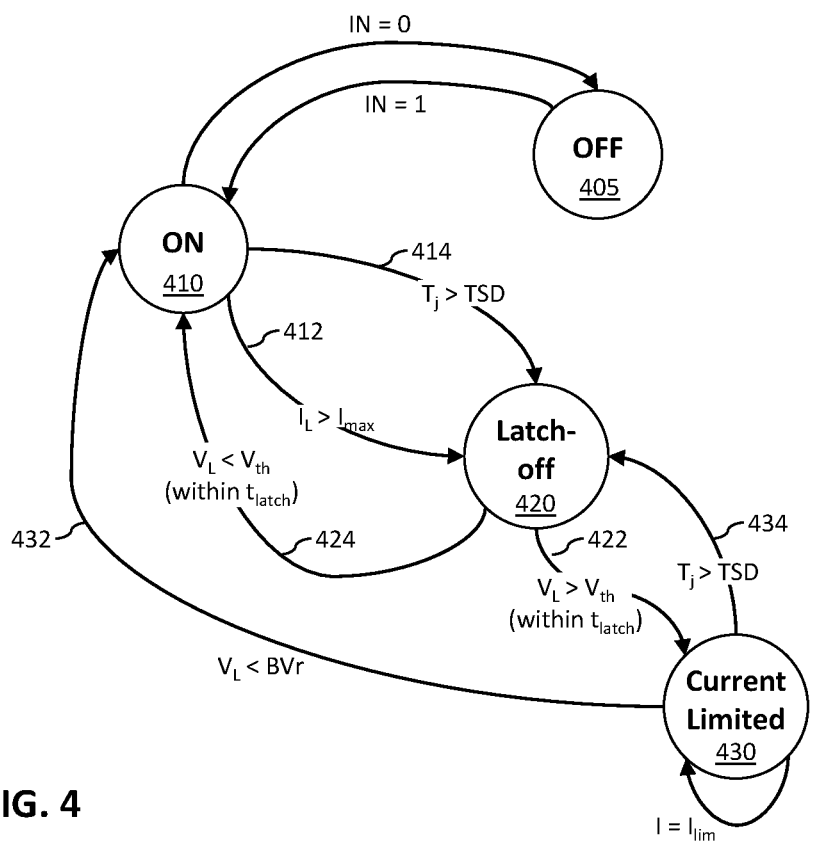
FIG. 4 is a state diagram illustrating an example of a method of controlling a power switch module.

FIG. 4 is a state diagram illustrating an example of a method of controlling a power switch module, such as may be implemented within the control component 330 of FIG. 3. In an initial OFF state 405, the control component 330 is arranged to control the switching device 320 to decouple the load node 306 from the power supply node 302. Upon the control component 330 receiving an indication to 'turn on' the power switch module, for example by way of an input signal IN 305 (FIG. 3) being set to a '1' value, the control component 330 is arranged to transition the power switch module 300 into an ON state 410 in which the control component 330 is arranged to configure the switching device 320 to be turned on such that the load node 306 is coupled to the power supply node 302.

When in the ON state 410, if one of the received operating condition indications 332, 334 fulfils a predefined protection condition, for example the indicated current-flow $I_L$ 332 through the switching device 320 exceeds a maximum (over-current) threshold ($I > I_{max}$), for example in the region 50A, or the indicated junction temperature Tj 334 for the switching device 320 exceeds a temperature threshold (TSD), for example in the region of 175° C., the control component 330 is arranged to transition the power switch module 300 from the ON state 410 to a latched-OFF state 420, as indicated by transitions 412, 414.

In the latched-OFF state 420, the control component 330 is arranged to configure the switching device 320 to be turned off to decouple the load node 306 from the power supply node 302, thereby protecting the switching device 320 from potentially damaging conditions such as over-current or over-temperature conditions. In the latched-OFF state 420, the control component 330 is further arranged to determine whether the indicated voltage level $V_L$ 336 at the load node exceeds a threshold voltage level ($V_{th}$).

If it is determined that the voltage level $V_L$ 336 at the load node exceeds the threshold voltage level ($V_{th}$), the control component 330 is arranged to transition the power switch module 300 from the latched-OFF state 420 to a current-limited state 430, as indicated at 422. In the current-limited state 430, the control component 330 is arranged to configure the switching device 320 to be turned on to couple the load node 306 to the power supply node 302, and to further control the switching device 320 to limit current-flow there through. For example, when the power switch module 300 is in the current-limited state 430, the control component 330 may be arranged to turn the switching device 320 off if the indicated current-flow $I_L$ 332 through the switching device 320 exceeds a first current-limiting threshold value Ith_high, and to subsequently turn the switching device 320 back on when the indicated current-flow $I_L$ 332 through the switching device 320 is below a second current-limiting threshold value Ith_low; wherein $I_{th\_high} \geq I_{th\_low}$.

In this manner, the switching device 320 is protected from an over-current condition, whilst still enabling the load node 306 to be coupled to the power supply node 302, and thus still enabling power to be provided from the power supply Vsup 304 to the ECU 310.

In the illustrated example, when the power switch module 300 is in the latched-OFF state 420, if it is determined that the voltage level $V_L$ 336 at the load node 306 does not exceed the threshold voltage level ($V_{th}$), the control component 330 is arranged to transition the power switch module 300 from the latched-OFF state 420 back to the ON state 410, as indicated at 424.

In some examples, and as illustrated in FIG. 4, it is contemplated that, when the power switch module 300 is in the latched-OFF state 420, the control component 330 is arranged to transition the power switch module 300 from the latched-OFF state 420 to the applicable of the current-limited state 430 and the ON state 410 within a defined period of time $t_{latch}$, for example within 5 milliseconds, of the power switch module 300 being transitioned to the latched-OFF state 420.

In the example illustrated in FIG. 4, when the power switch module 300 is in the current-limited state 430, if the voltage level $V_L$ 336 at the load node 306 subsequently falls below the threshold voltage level ($V_{th}$), the control component 330 is arranged to transition the power switch module 300 to the ON state 410, as indicated at 432. In this manner, normal operation of the power switch module 300 may be resumed upon a cause of the voltage level $V_L$ 336 at the load node 306 exceeding the threshold voltage level ($V_{th}$) being resolved/removed.

Conversely, if the indicated junction temperature Tj 334 for the switching device 320 exceeds the temperature threshold (TSD) when the power switch module 300 is in the current-limited state 430, the control component 330 is arranged to transition the power switch module 300 back to the latched-state 420, as indicated at 434. In this manner, the switching device 320 is protected from an over-temperature condition (for example due in part to a high ambient temperature etc.) when the power switch module 300 is in the latched-off state 420.

Figure 5:
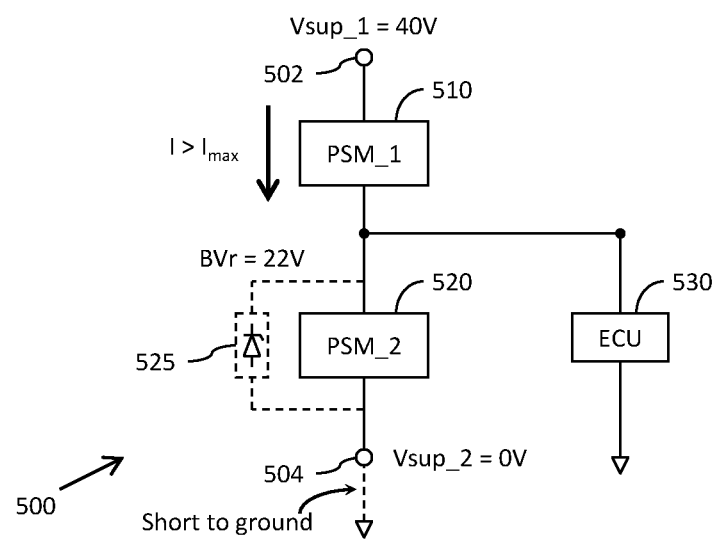
FIG. 5 illustrates a simplified block diagram of an example of a smart grid power supply arrangement.

FIG. 5 illustrates a simplified block diagram of an example of a smart grid power supply arrangement 500 consisting of two power supply lines, Vsup_1 502 and Vsup_2 504. It will be appreciated that in practice such a smart grid power supply arrangement 500 may consist of more than two power supply lines, for example eight.

However, for clarity and ease of understanding, the smart grid power supply arrangement 500 of FIG. 5 is illustrated and described as consisting of just the two power supply lines, Vsup_1 502 and Vsup_2 504.

The first power supply line Vsup_1 502 may be coupled to a power supply (not shown) via a first primary power switch (not shown), whilst the second power supply line Vsup_2 504 may be coupled to the power supply via a second primary power switch (not shown). An ECU 530 is coupled to the first power supply line Vsup_1 502 via a first power switch module 510, and to the second power supply line Vsup_2 504 via a second power switch module 520. The first and second secondary power switch modules 510, 520 illustrated in FIG. 5 each consist of a power switch module 300 illustrated in FIG. 3.

In the example illustrated in FIG. 5, a short circuit to ground has occurred on the second power supply line Vsup_2 504. When the second power supply line Vsup_2 104 is shorted to ground, a resulting over-current through the second primary power switch (not shown) will cause the second primary power switch protection circuitry to latch-off the second primary power switch, isolating the second power supply line Vsup_2 504 from the power supply (not shown). As a result, the second power supply line Vsup_2 504 will be tied to ground, and have a voltage level of 0V. Consequently, the secondary power switch modules 510, 520 will end up being coupled in series between the first power supply line Vsup_1 502, having a voltage equal to the power supply (not shown), and the second power supply line Vsup_2 504, having a voltage of 0V. In automotive applications and the like, the power supply may reach voltage levels in the region of, for example, 40V during a load dump. As a result, and as illustrated in FIG. 5, the first power supply line Vsup_1 502 may have a voltage level of 40V.

Thus, in the supply line short circuit scenario illustrated in FIG. 5, a 40V drop occurs across the secondary power switch modules 510, 520, with an initial low resistance path through the secondary power switch modules 510, 520 from the first power supply line Vsup_1 502 to the second power supply line Vsup_2 504.

A resulting high current flow through the first power switch module 510 will cause the current-flow through the first power switch module 510 to exceed a maximum (over-current) threshold ($I>I_{max}$). As a result, the control component 330 of the first power switch module 510 will transition the first power switch module 510 from the ON state 410 into the latched-OFF state 420.

Substantially simultaneously, a resulting high reverse voltage across the second power switch module 520 will trigger reverse voltage protection circuitry, illustrated generally at 525, that will limit the reverse voltage across the second power switch module 520 (by allowing current to bypass the switching device 320 of the second power switch module 520 when the reverse voltage exceeds a threshold, e.g. 22V).

As a result of the first secondary-power switch 130 being latched off, the ECU 150 is no longer coupled to an active power supply line, and thus no longer being supplied with power. Accordingly, although the original fault only occurred on one of the power supply lines (i.e. the short to ground on the second power supply line Vsup_2 504), the fault has resulted in the protection circuitry of the power switches 510, 520 decoupling the ECU 150 from the fault-free power supply line Vsup_1 502, leaving the ECU without a power supply.

Figure 1:
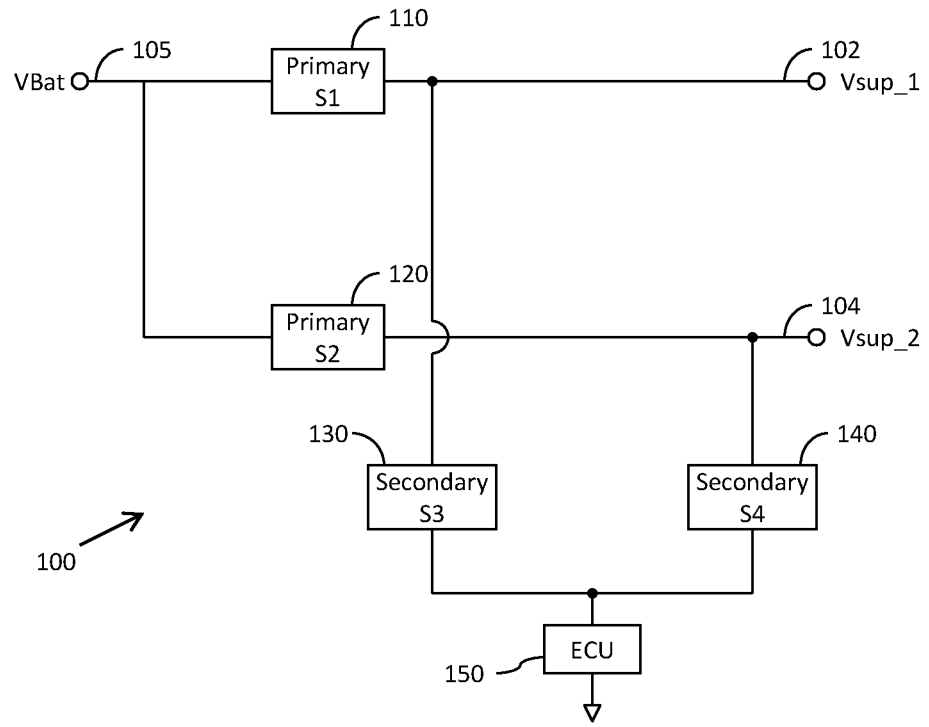
FIG. 1 illustrates a simplified block diagram of a smart grid power supply arrangement for an electronic control unit.
Figure 2:
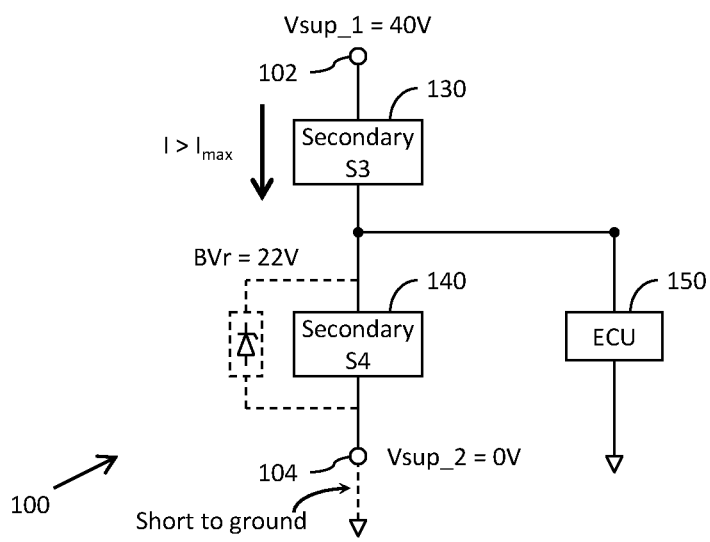
FIG. 2 illustrates the smart grid power supply arrangement of FIG. 1 upon a short circuit to ground occurring on a power supply line.

Implementing the secondary power switches in such a smart grid power supply arrangement using conventional smart power switch components, as illustrated in FIG. 2, would result in the first power switch 510 to be reset in order to return power to the ECU 530. However, resetting the first power switch 510 would result in a high current flow through the reverse voltage protection circuitry 525, retriggering the over-current protection of the first power switch 510.

Conversely, by implementing the power switch module 300 of FIGS. 3 and 4, the high voltage level (e.g. ~22V in the case of a 22V reverse breakdown voltage for the reverse voltage protection circuitry 525) at the load node 306 of the first power switch module 510 will be detected by the control component 330 of the first power switch module 510 when transitioned to the latched-OFF state 420, causing the control component 330 of the first power switch module 510 to transition the first power switch module 510 into the current-limited state 430. As a result, the ECU 530 re-coupled to the first voltage supply line 502, whilst the current-flow through the first power switch module 510 is limited to avoid an over-current condition occurring again. Thus, the availability of the ECU 530 following such a short-to-ground event occurring on a voltage supply line can be maintained. Accordingly, in some example it is contemplated that the threshold voltage level ($V_{th}$) to which the indicated voltage level $V_L$ 336 at the load node 306 is compared may be set substantially equal to a reverse breakdown voltage (BVr) for the switching device 320.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A power switch module comprising:
    a power supply node arranged to be coupled to a power supply;
    a load node arranged to be coupled to a load;
    a switching device coupled between the power supply node and the load node and controllable to selectively couple the power supply node to the load node; and
    a control component arranged to receive at least one indication of an operating condition for the switching device,
    wherein the control component is further arranged to, upon the power switch module transitioning to a latched-OFF state:
        determine whether a voltage level at the load node exceeds a threshold voltage level; and
        if it is determined that the voltage level at the load node exceeds the threshold voltage level, transition the power switch module from the latched-OFF state to a current-limited state in which the control component is arranged to configure the switching device to be turned on to couple the load node to the power supply node, and to further control the switching device to limit current-flow there through;
    wherein when the power switch module is in the latched-OFF state the control component is arranged to transition the power switch module from the latched-OFF state to the applicable of the current-limited state and the ON state within a defined period of time $t_{latch}$ of the power switch module being transition to the latched-OFF state.

2. The power switch module of claim 1, wherein when the power switch module is in the latched-OFF state the control component is further arranged to transition the power switch module from the latched-OFF state back to the ON state, if it is determined that the voltage level at the load node does not exceed the threshold voltage level.

3. The power switch module of claim 2, wherein when the power switch module is in the latched-OFF state the control component is arranged to transition the power switch module from the latched-OFF state to the applicable of the current-limited state and the ON state within five milliseconds of the power switch module being transition to the latched-OFF state.

4. The power switch module of claim 1, wherein the control component is arranged to receive an indication of the current-flow within the switching device, and when the power switch module is in the current-limited state, the control component is arranged to turn the switching device off if the indicated current-flow within the switching device exceeds a first current-limiting threshold value $I_{th\_high}$, and to subsequently turn the switching device back on when the indicate current-flow within the switching device is below a second current threshold value $I_{th\_low}$; wherein $$I_{th\_high} > I_{th\_low}.$$

5. The power switch module of claim 1, wherein the at least one operating condition indication for the switching device comprises at least one of:
   an indication of current-flow through the switching device; and
   an indication of a junction temperature for the switching device.

6. The power switch module of claim 1, wherein the threshold voltage is equal to a reverse breakdown voltage for the switching device.

7. A smart grid power supply arrangement comprising a power switch module coupled between a power supply line and a load; the power switch module comprising:
   a power supply node coupled to the power supply line,
   a load node coupled to the load,
   a switching device coupled between the power supply node and the load node and controllable to selectively couple the power supply node to the load node, and
   a control component arranged to receive at least one operating condition indication for the switching device;
   wherein the control component is further arranged to, upon the power switch module transitioning to a latched-OFF state:
      determine whether a voltage level at the load node exceeds a threshold voltage level; and
      if it is determined that the voltage level at the load node exceeds the threshold voltage level, transition the power switch module from the latched-OFF state to a current-limited state in which the control component is arranged to configure the switching device to be turned on to couple the load node to the power supply node, and to further control the switching device to limit current-flow there through;
      wherein when the power switch module is in the latched-OFF state the control component is arranged to transition the power switch module from the latched-OFF state to the applicable of the current-limited state and the ON state within a defined period of time of the power switch module entering the latched-OFF state.

8. The smart grid power supply arrangement of claim 7, wherein when the power switch module is in the latched-OFF state the control component is further arranged to transition the power switch module from the latched-OFF state back to the ON state, if it is determined that the voltage level at the load node does not exceed the threshold voltage level.

9. The smart grid power supply arrangement of claim 8, wherein when the power switch module is in the latched-OFF state the control component is arranged to transition the power switch module from the latched-OFF state to the applicable of the current-limited state and the ON state within five milliseconds of the power switch module entering the latched-OFF state.

10. The smart grid power supply arrangement of claim 7, wherein the control component is arranged to receive an indication of the current-flow within the switching device, and when the power switch module is in the current-limited state, the control component is arranged to turn the switch off if the indicated current-flow within the switching device exceeds a first current threshold value $I_{th\_high}$, and to subsequently turn the switching device back on when the indicate current-flow within the switching device is below a second current threshold value $I_{th\_low}$; wherein the first current threshold value $I_{th\_high} \geq$ the second current threshold value $I_{th\_low}$.

11. The smart grid power supply arrangement of claim 7, wherein the control component is arranged to receive an indication of a junction temperature for the switching device, and when the power switch module is in the current-limited state, the control component is arranged to transition the switching device from the current-limited state back to the latched-off state.

12. The smart grid power supply arrangement of claim 7, wherein the at least one operating condition indication for the switching device comprises at least one of:
   an indication of current-flow through the switching device; and
   an indication of a junction temperature for the switching device.

13. The smart grid power supply arrangement of claim 7, wherein the threshold voltage is equal to a reverse breakdown voltage for the switching device.

14. The smart grid power supply arrangement of claim 7, wherein the load comprises an electronic control unit.

15. A method of controlling a power switch module, the method comprising, upon the power switch module transitioning to a latched-OFF state:
   determining whether a voltage level at the load node exceeds a threshold voltage level; and
   if it is determined that the voltage level at the load node exceeds the threshold voltage level, transitioning the power switch module from the latched-OFF state to a current-limited state in which the switching device is configured to be turned on to couple the load node to the power supply node, and the switching device is further controlled to limit current-flow there through;
   wherein when the power switch module is in the latched-OFF state the method further comprises transitioning the power switch module from the latched-OFF state to the applicable of the current-limited state and the ON state within a defined period of time $t_{latch}$ of the power switch module being transition to the latched-OFF state.

16. The method of claim 15, wherein when the power switch module is in the latched-OFF state the method further comprises transitioning the power switch module from the latched-OFF state back to the ON state, if it is determined that the voltage level at the load node does not exceed the threshold voltage level.

17. The method of claim 16, wherein when the power switch module is in the latched-OFF state the method further comprises transitioning the power switch module from the latched-OFF state to the applicable of the current-limited state and the ON state within five milliseconds of the power switch module being transition to the latched-OFF state.

18. The method of claim 15, wherein the method comprises receiving an indication of the current-flow within the switching device, and when the power switch module is in the current-limited state, turning the switching device off if the indicated current-flow within the switching device exceeds a first current-limiting threshold value $I_{th\_high}$, and subsequently turning the switching device back on when the indicate current-flow within the switching device is below a second current threshold value $I_{th\_low}$; wherein $$I_{th\_high} \geq I_{th\_low}.$$

19. The method of claim 15, wherein the at least one operating condition indication for the switching device comprises at least one of:
   an indication of current-flow through the switching device; and
   an indication of a junction temperature for the switching device.

20. The method of claim 15, wherein the threshold voltage is equal to a reverse breakdown voltage for the switching device.

* * * * *